(12) United States Patent
Yin et al.

(10) Patent No.: US 10,833,222 B2
(45) Date of Patent: Nov. 10, 2020

(54) HIGH LIGHT EXTRACTION EFFICIENCY (LEE) LIGHT EMITTING DIODE (LED)

(71) Applicant: The Penn State Research Foundation, University Park, PA (US)

(72) Inventors: Shizhuo Yin, State College, PA (US); Chang-Jiang Chen, State College, PA (US); Ju-Hung Chao, State College, PA (US); Wenbin Zhu, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 1 day.

(21) Appl. No.: 16/327,759

(22) PCT Filed: Aug. 10, 2017

(86) PCT No.: PCT/US2017/046255
§ 371 (c)(1),
(2) Date: Feb. 22, 2019

(87) PCT Pub. No.: WO2018/038927
PCT Pub. Date: Mar. 1, 2018

(65) Prior Publication Data
US 2019/0237622 A1    Aug. 1, 2019

Related U.S. Application Data

(60) Provisional application No. 62/379,888, filed on Aug. 26, 2016.

(51) Int. Cl.
*H01L 33/22* (2010.01)
*H01L 33/20* (2010.01)
(Continued)

(52) U.S. Cl.
CPC ............... *H01L 33/22* (2013.01); *H01L 33/06* (2013.01); *H01L 33/20* (2013.01); *H01L 33/305* (2013.01);
(Continued)

(58) Field of Classification Search
CPC ......... H01L 33/22; H01L 33/20; H01L 33/60; H01L 33/325; H01L 33/305; H01L 33/06;
(Continued)

(56) References Cited

U.S. PATENT DOCUMENTS 6,133,589 A    10/2000 Krames et al.
7,534,633 B2   5/2009 Batres et al.
(Continued)

OTHER PUBLICATIONS

International Search Report dated Oct. 24, 2017, International Application No. PCT/US2017/046255 filed Aug. 10, 2017.

*Primary Examiner* — Sitaramarao S Yechuri
(74) *Attorney, Agent, or Firm* — Dinsmore & Shohl LLP

(57) ABSTRACT

A light-emitting diode, comprising a substrate that has a first surface and an opposing second surface. A reflection layer is disposed on the first surface of the substrate and a light-emitting diode structure is arranged on the second surface of the substrate. The light-emitting diode structure includes a first semiconducting layer, an active layer and a second semiconducting layer disposed consecutively on the second surface. A plurality of protruding asymmetric micro-structured elements define at least a part of the second surface of the substrate such that at least a portion of a surface of each micro-structured element is disposed at an obtuse angle to the first surface of the substrate when measured from within the respective micro-structured element. The first semiconducting layer and the second semiconducting layer respectively have a first electrode and a second electrode.

18 Claims, 7 Drawing Sheets

(51) Int. Cl.
  *H01L 33/06* (2010.01)
  *H01L 33/30* (2010.01)
  *H01L 33/32* (2010.01)
  *H01L 33/60* (2010.01)
  *H01L 33/46* (2010.01)
  *H01L 33/00* (2010.01)
(52) U.S. Cl.
  CPC ............ *H01L 33/325* (2013.01); *H01L 33/60* (2013.01); *H01L 33/007* (2013.01); *H01L 33/0008* (2013.01); *H01L 33/0093* (2020.05); *H01L 33/46* (2013.01)
(58) Field of Classification Search
  CPC ............... H01L 33/007; H01L 33/0079; H01L 33/0008; H01L 33/46
  See application file for complete search history.

(56) References Cited

U.S. PATENT DOCUMENTS

| | | | |
|---|---|---|---|
| 7,633,097 B2 | 12/2009 | Kim et al. | |
| 7,777,241 B2 | 8/2010 | Moustakas et al. | |
| 8,405,068 B2 | 3/2013 | O'Keefe | |
| 8,410,490 B2 | 4/2013 | Denbaars et al. | |
| 8,450,776 B2 | 5/2013 | deVilliers et al. | |
| 8,673,666 B2 | 3/2014 | Huang | |
| 8,835,200 B2 | 9/2014 | Zhong et al. | |
| 8,946,748 B2 * | 2/2015 | Kim | H01L 33/46 257/98 |
| 2001/0033135 A1 | 10/2001 | Duggal et al. | |
| 2002/0141006 A1 * | 10/2002 | Pocius | H01L 33/44 359/15 |
| 2003/0085411 A1 * | 5/2003 | Shibata | H01L 31/1852 257/190 |
| 2005/0145862 A1 | 7/2005 | Kim et al. | |
| 2005/0179130 A1 * | 8/2005 | Tanaka | H01L 21/02433 257/730 |
| 2005/0230699 A1 * | 10/2005 | Wu | H01L 33/22 257/98 |
| 2006/0163595 A1 * | 7/2006 | Hsieh | H01L 33/22 257/95 |
| 2007/0018182 A1 | 1/2007 | Beeson et al. | |
| 2008/0173863 A1 * | 7/2008 | Hahn | H01L 33/22 257/13 |
| 2009/0141502 A1 | 6/2009 | Sonoda et al. | |
| 2010/0140636 A1 * | 6/2010 | Donofrio | H01L 33/46 257/98 |
| 2011/0024722 A1 * | 2/2011 | Moustakas | H01L 21/02389 257/13 |
| 2013/0126829 A1 | 5/2013 | Yoon et al. | |
| 2013/0292687 A1 * | 11/2013 | Jiang | H01L 31/1852 257/76 |
| 2013/0328081 A1 | 12/2013 | Zhang et al. | |
| 2014/0326946 A1 | 11/2014 | Wei et al. | |
| 2016/0149081 A1 * | 5/2016 | Yamasaki | H01L 33/20 257/98 |
| 2017/0148958 A1 * | 5/2017 | Yamada | H01L 33/507 |
| 2017/0338369 A1 * | 11/2017 | Wildeson | H01L 33/0095 |

* cited by examiner

HIGH LIGHT EXTRACTION EFFICIENCY (LEE) LIGHT EMITTING DIODE (LED)

CROSS-REFERENCE TO RELATED APPLICATIONS

This application is the U.S. national stage of PCT/US2017/046255 filed Aug. 10, 2017, which claims priority of U.S. Provisional Patent Application 62/379,888 filed Aug. 26, 2016 of which is hereby incorporated by reference in its entirety.

FIELD OF THE INVENTION

The present invention relates in general to Light-Emitting Diodes (LEDs) and, more particularly, to a design and method for a high light-extraction efficiency (LEE) LED.

BACKGROUND OF THE INVENTION

Light-emitting diodes (LED or LEDs) are solid-state devices that convert electric energy to light, and generally comprise one or more active layers of semiconductor material sandwiched between oppositely doped layers. When a voltage is applied across the doped layers, holes and electrons are injected into the active layer where they recombine to generate light. Light is emitted from the active layer and from all surfaces of the LED.

Generally, an existing LED has been widely used as a backlight unit for a liquid crystal display device used in mobile phones, televisions (TVs), Personal Digital Assistants (PDAs), or notebook computers. Further, with the development of LED manufacturing technologies, efficiency has increased, brightness is greatly improved, and thus LEDs are not only used as light sources for large-sized LCD devices, such as TVs, but are also widely used for typical lighting, security lights, street lamps, etc. A LED has a long lifespan, environmentally-friendly characteristics, and an expectation to be widely used for normal lighting in the future via continuous efforts to improve electric-to-light conversion efficiency and reduce the cost.

Currently, concern about a global energy shortage has been raised again, and energy conservation has become an important issue. In the illumination field, LED lighting is booming as a revolutionary energy-saving illumination technology. LED-lamps, as a new type of green lighting product, are energy saving and environmental friendly, which may be the future development trend, and the twenty-first century will enter an era of adopting new illuminating sources represented by LED lighting.

Light-emitting diodes (LEDs) have a growing and a sizable market. As reported in LEDinside, the worldwide LED lighting market will grow from US $25.7 billion in 2015 to US $30.5 billion in 2016. One of the key parameters of a LED is the light-extraction efficiency (LEE). Due to the high refractive index of the LED material [e.g., n≈2.5 for gallium nitride (GaN)], a portion of the light cannot escape from the active area of a LED, which lowers the LEE. There have been continuous efforts to improve the LEE.

One prior art method is to create micro and/or nanostructured roofs or so-called overlayers on an exit surface of a LED, as illustrated in FIG. 1. According to this prior art method, a LED 10 is composed of a substrate 101, a n-type GaN layer 102, a n-type electrode 103, an active layer 104, a p-type GaN layer 105, a p-type electrode 106, and a micro and/or nanostructured roof or overlayer 110, in which angles $\alpha$ and $\beta$ are within the range of $0<\alpha\leq90°$ and $0<\beta\leq90°$. Light is generated when electrons and holes recombine at the active layer 104. Some emitted light rays (e.g., Ray 108) exit out the surface 111 due to the existence of overlayer 110. However, there are still some light rays (e.g., Ray 109) that reflect back from surface 111 even with the existence of overlayer 110.

Another prior art method is to fabricate the LED 20 on a micro structured substrate, as illustrated in FIG. 2, see e.g., U.S. Pat. Nos. 8,450,776, 6,133,589, 7,633,097, 7,777,241, and 7,534,633. The LED 20 is composed of a micro structured substrate 201 (e.g., made of sapphire, silicon carbide, silicon), a reflection layer 202, a n-type GaN layer 203, an active layer 204, a N-type electrode 205, a p-type GaN layer 206, and a p-type electrode 207. There may also be a buffer layer between the substrate and n-type GaN layer to improve the lattice match. In all these prior art methods, the angles $\alpha$ and $\beta$ are within the range of $0<\alpha\leq90°$ and $0<\beta\leq90°$. These micro structured substrates can help (1) to create a better lattice match between the substrate (e.g., sapphire) and GaN layer and (2) to increase the LEE. For example, the light ray 211 exits out the LED due to the reflection by the microstructured surface 208. However, there are still light rays that cannot exit out and are trapped in the LED 20 even with the existence of microstructured substrate. For example, the ray 212 is first refracted by surface 221, then reflected by reflector 202, further refracted by surface 222 and finally reflected by surface 223, resulting in lower light-extraction efficiency. Thus, it would be desirable to overcome the limitations of the existing LEDs and to provide a better solution.

SUMMARY OF THE INVENTION

In accordance with an embodiment of the present invention, a high-light-extraction efficiency light-emitting diode consists of a substrate with a first surface and an opposing second surface. A reflection layer is disposed on the first surface of the substrate and a light-emitting diode structure is arranged on the second surface of the substrate. The light-emitting diode structure includes a first semiconducting layer, an active layer and a second semiconducting layer disposed consecutively on the second surface. A plurality of protruding asymmetric micro-structured elements define at least a part of the second surface of the substrate. A portion of a surface of each micro-structured element is disposed at an obtuse angle with respect to the first surface of the substrate when measured from within the respective micro-structured element. Each protruding micro-structured element is asymmetric with respect to a plane substantially parallel to the first surface of the substrate and to a plane substantially perpendicular to the first surface of the substrate.

In some embodiments, the first semiconducting layer has a first electrode and/or the second semiconducting layer has a second electrode. The plurality of protruding asymmetric micro-structured elements each may have a curved surface. In some embodiments, the plurality of protruding asymmetric micro-structured elements of the substrate are created by a dry-etching or direction wet-etching method.

To enhance the light extraction efficiency of the light-emitting diode, an overlayer may be deposited on the second semiconducting layer. The overlayer has a plurality of protruding asymmetric micro-structured elements. At least a portion of a surface of each micro-structured element of the overlayer is disposed at an obtuse angle with respect to the second semiconducting layer when measured from within the respective micro-structured element. Each protruding micro-structured element of the overlayer is asymmetric with respect to a plane substantially parallel to the second semiconducting layer and to a plane substantially perpendicular to the second semiconducting layer.

In some embodiments, a plurality of micro and/or nano structured members are disposed on each of the plurality of protruding asymmetric micro-structured elements of the overlayer. In other embodiments, the plurality of protruding asymmetric micro-structured elements of the overlayer each has a curved surface.

In another embodiment in accordance with the present invention, a high-light-extraction efficiency light-emitting diode has a substrate with a first surface, an opposing second surface, and a reflection layer disposed on the first surface of the substrate. A light-emitting diode structure is arranged on the second surface of the substrate. The light-emitting diode structure includes a first semiconducting layer, an active layer, a second semiconducting layer and an overlayer disposed consecutively on the second surface. The overlayer has a plurality of protruding asymmetric micro-structured elements. To increase the light extraction efficiency, at least a portion of a surface of each micro-structured element of the overlayer is disposed at an obtuse angle with respect to the second semiconducting layer when measured from within the respective micro-structured element. Moreover, each protruding micro-structured element of the overlayer is asymmetric with respect to a plane substantially parallel to the second semiconducting layer and to a plane substantially perpendicular to the second semiconducting layer. The overlayer is transparent within an emission wavelength range of the light-emitting diode.

In some embodiments, the first semiconducting layer and the second semiconducting layer has a first electrode or a second electrode, respectively. The plurality of protruding asymmetric micro-structured elements of the overlayer each may have a curved surface, which enhances the light extraction efficiency of the light emitting diode. Some embodiments have a plurality of micro and/or nano structured members disposed on each of the plurality of protruding asymmetric micro-structured elements of the overlayer.

In yet another embodiment of the present invention, a high-light-extraction efficiency light-emitting diode includes a first semiconducting layer with a first surface and an opposing second surface. A first electrode is arranged on the first semiconducting layer and a light-emitting diode structure is arranged on the second surface of the first semiconducting layer. The light-emitting diode structure includes an active layer, a second semiconducting layer and a second electrode disposed consecutively on the second surface. A plurality of protruding asymmetric micro-structured elements define at least a part of the first surface of the first semiconducting layer. At least a portion of a surface of each micro-structured element is disposed at an obtuse angle with respect to the second surface of the first semiconducting layer when measured from within the respective micro-structured element, wherein each protruding micro-structured element is asymmetric with respect to a plane substantially parallel to the second surface of the first semiconducting layer and to a plane substantially perpendicular to the second surface of the first semiconducting layer. The plurality of protruding asymmetric micro-structured elements each may have a curved surface.

The plurality of protruding asymmetric micro-structured elements of the first semiconducting layer may be created by a dry-etching or direction wet-etching method. The light-emitting diode may be fabricated by using a flip-chip light-emitting diode manufacturing technique. A plurality of micro and/or nano structured members may be disposed on each of the plurality of protruding asymmetric micro-structured elements of the first surface of the first semiconducting layer. In some embodiments, the first electrode is arranged on the first surface or the second surface of the first semiconducting layer. In some embodiments, the first semiconducting layer and the second semiconducting layer comprise a p-type layer and a n-type layer respectively. In other embodiments, the first semiconducting layer and the second semiconducting layer may comprise a n-type layer and a p-type layer respectively.

The following features may also be incorporated in the above described embodiments of the high-light-extraction efficiency light-emitting diode. The plurality of protruding asymmetric micro-structured elements have a base and the base may be selected from the group consisting of a hex shape base, a triangular shape base, a square shape base, a circular shape base, an elliptical shape base and a polygon shape base. The substrate of the light-emitting diode may consist of sapphire, crystalline silicon, crystalline silicon carbide, gallium nitride, gallium arsenide, indium phosphor, or an organic material. The first semiconducting layer and the second semiconducting layer may consist of a n-type layer and a p-type layer respectively. In some light-emitting diodes, the first semiconducting layer or the second semiconducting layer are formed of a doped $(Al_xGa_{1-x})_yIn_{1-y}P$ (where $0 \leq x$, $y \leq 1$), doped $Al_yIn_xGa_{1-x-y}N$ (where $0 \leq x$, $y \leq 1$), doped $Al_xGa_{1-x}As$ ($0 \leq x \leq 1$), or doped organic material, wherein Al is aluminum, Ga is gallium, In is indium, P is phosphor, As is arsenide, and N is nitride. The first semiconductor layer or the second semiconducting layer may be doped with Silicon (Si) or Magnesium (Mg).

There are several techniques to grow the semiconducting layers to fabricate a LED. In some embodiments, the doped $(Al_xGa_{1-x})_yIn_{1-y}P$ or the doped $Al_yIn_xGa_{1-x-y}N$ is grown by a metal oxide chemical vapor deposition (MOCVD) method. In other embodiments, a liquid phase epitaxy (LPE) method may be used to grow the doped semiconducting layer $Al_xGa_{1-x}As$.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the embodiments of the present invention, an example of which is illustrated in the accompanying drawings. Wherever possible, the same reference numbers are used throughout the drawings and refer to the same or like parts. Furthermore, it is required that the present invention is understood, not simply by the actual terms used, but by the meaning of each term laying within. Additional advantages, objects, and features of the invention will be set forth in part in the description that follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

Figure 3A:
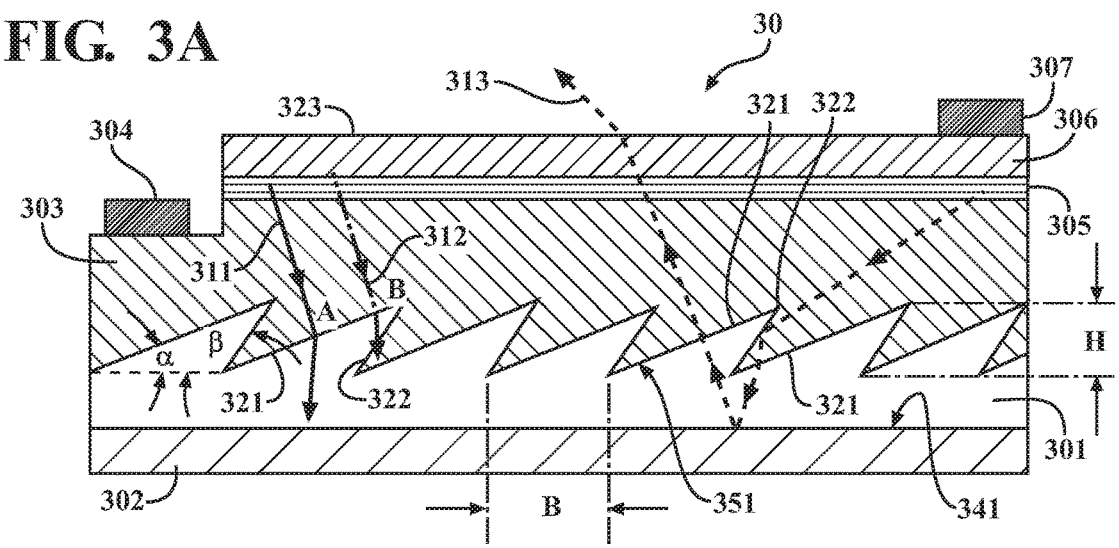
FIG. 3A illustrates a two-dimensional (2D) drawing of one embodiment of the present invention, in which the LED 30 has a novel asymmetric obtuse angle micro-structured substrate 301.
Figure 3B:
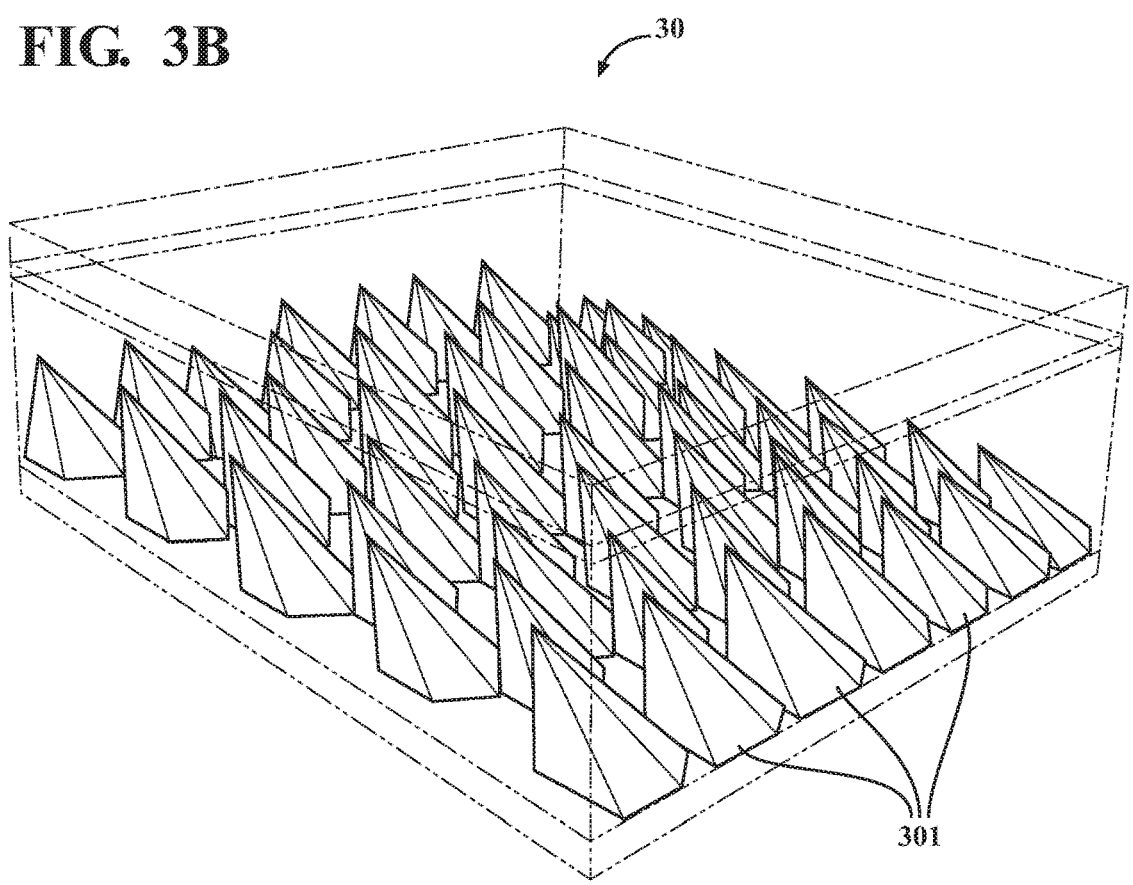
FIG. 3B illustrates a three-dimensional (3D) drawing of one embodiment of the present invention, in which the LED 30 contains a novel asymmetric obtuse angle micro-structured substrate 301.
Figure 3C:
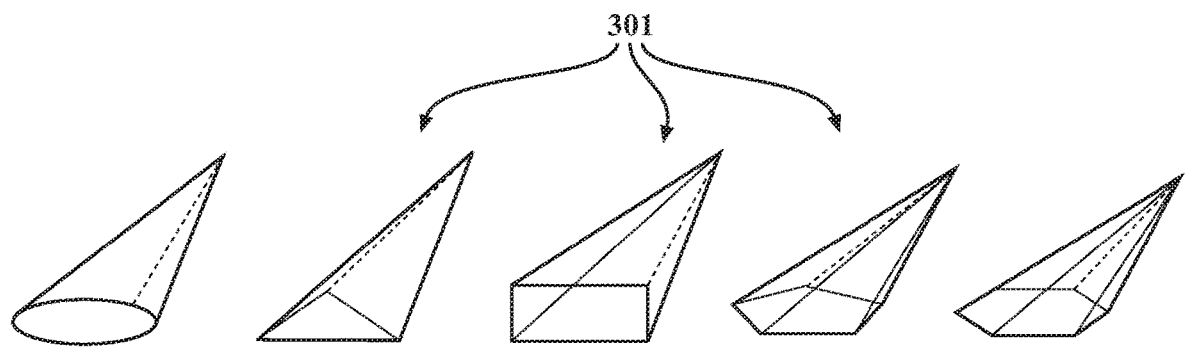
FIG. 3C illustrates different shapes for a base of a protruding asymmetric micro-structured element.

To overcome the limitations of the prior art micro-structured substrate, one embodiment in accordance with the present invention is a LED 30 that is fabricated from a novel substrate 301 that has a plurality of protruding asymmetric micro-structured elements, as illustrated in FIGS. 3A, 3B, and 3C. FIG. 3A shows a two-dimensional (2D) drawing and FIG. 3B shows the three-dimensional (3D) drawing of an embodiment of the present invention. FIG. 3C illustrates examples of possible shapes of the protruding asymmetric micro-structured elements, including the micro-structured elements having a hex shape base, a triangular shape base, a square shape base, a circular shape base, and an elliptical shape base. There may also be other shapes such as polygon shape base, or a base with other irregular shapes. The LED 30 is composed of a substrate 301 with a first surface 341 and a second surface 351. A light-emitting diode structure is arranged on the second surface 351. The light-emitting diode structure consists of a first semiconducting layer 303, an active layer 305, and a second semiconducting layer 306 disposed consecutively on the second surface 351. Some embodiments may have the second surface 351 with a plurality of protruding asymmetric micro-structured elements, a reflection layer 302, a n-type GaN layer 303, a n-type electrode 304, an active layer 305, a p-type layer 306, and a p-type electrode 307. There may also be a buffer layer between substrate 301 and n-type GaN layer 303. The active quantum well layer 305 may emit light when an electron and a hole recombine. A plurality of protruding asymmetric micro-structured elements define at least a part of the second surface 351 of the substrate 301. At least a portion of a surface of each microstructured element is disposed at an obtuse angle with respect to the first surface 341 when measured from within the respective micro-structured element (i.e., one of the angles α or β is larger than 90°). It should be noted that the angles α or β are the internal angles between the two surfaces, respectively, of a micro-structured element and a plane shown by the dotted line at the base of the micro-structured elements. As will be clear to those of skill in the art, these angles may also be defined as the internal angle between the first surface 341 and the surfaces of the micro-structured element. The shape of each protruding micro-structured element is such that it is asymmetric with respect to a plane substantially parallel to the first surface 341 and also to a plane substantially perpendicular to the first surface 341.

Substrate 301 may be made of sapphire, crystalline silicon, crystalline silicon carbide, gallium nitride, gallium arsenide, indium phosphor, an organic substrate, or other suitable materials. In a non-limiting example, substrate 301 with a plurality of asymmetric micro-structured elements may be fabricated by dry-etching or directional (e.g., UV light assistant) wet-etching. During dry etching, the material of substrate 301 may be removed, typically using a masked pattern, to obtain the plurality of asymmetric micro-structured elements by exposing the material to a bombardment of ions. During bombardment, plasma of reactive gases such as fluorocarbons, oxygen, chlorine, and boron trichloride is used. Sometimes nitrogen, argon, helium and other gases are also added to these reactive gases to dislodge portions of the material of substrate 301 from the exposed surface. During wet-etching, substrate 301 with the plurality of asymmetric micro-structured elements may be fabricated by chemically removing layers from the second surface 351 of the substrate 301. Part of the surface of the substrate 301 may be protected from the etchant by a "masking" material that resists etching. Ultraviolet (UV) photo-assisted wet etching may also be used on the surface of substrate 301.

Figure 1:
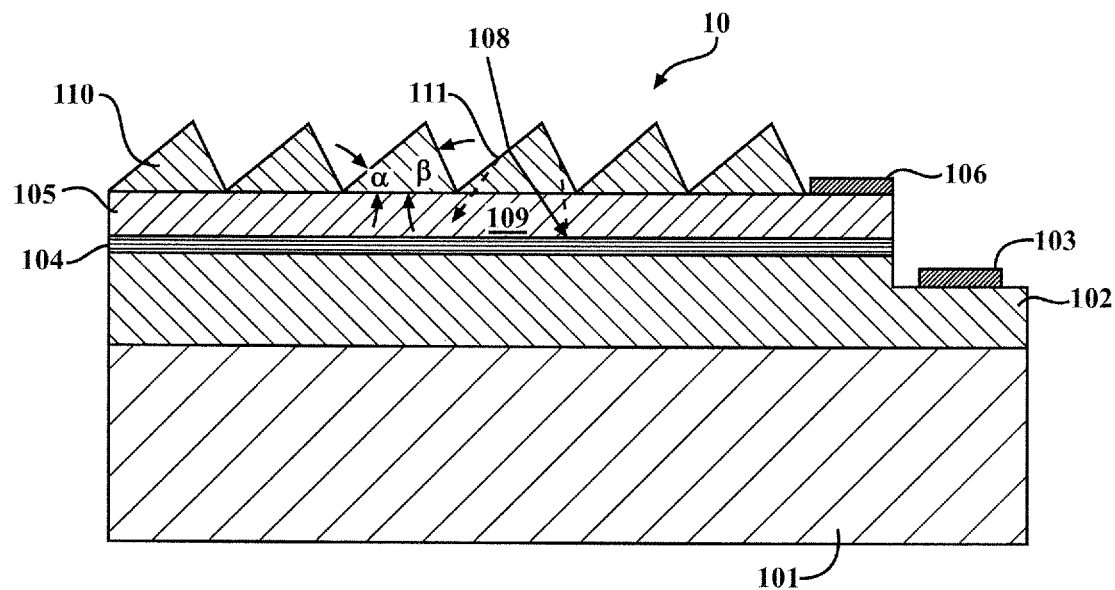
FIG. 1 illustrates a prior art LED 10 containing a micro and/or nanostructured roof or so-called overlayer, in which the angles α and β are within the range of 0<α≤90°, 0<β≤90°.
Figure 2:
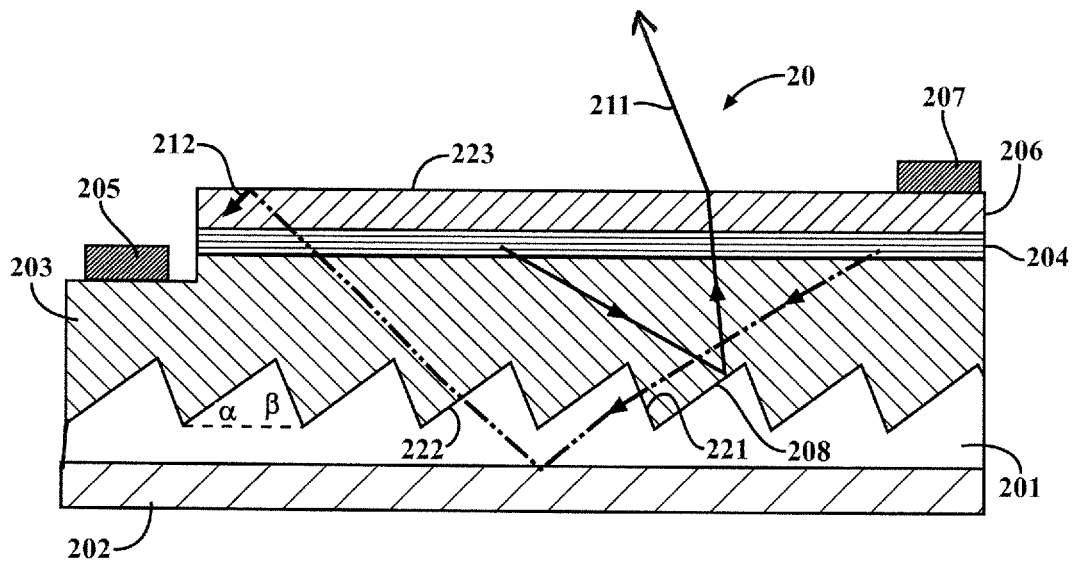
FIG. 2 illustrates a prior art LED 20 containing a micro-structured substrate, in which the angles α and β are within the range of 0<α≤90°, 0<β≤90°.

This novel substrate with a plurality of asymmetric micro-structured elements offers the high LEE due to the following unique features. First, with the same height-to-base aspect ratio (i.e., h/b as illustrated in FIG. 3A), substrate 301 with the plurality of asymmetric micro-structured elements has a larger surface area than that of the micro-structured substrate that does not contain an obtuse angle i.e. FIG. 2. Second, the light ray is better randomized when hitting the plurality of asymmetric micro-structured elements because the deflection angle can be a function of location. For example, when the light rays 311 and 312 propagate in the same direction and hit the location A and B, respectively on substrate 301 with the plurality of asymmetric micro-structured elements, they deflect differently. In location A, it is only deflected by surface 321. However, in location B, it is deflected by both surfaces 321 and 322 due to the existence of an obtuse angle β. Thus, the output direction of rays 311 and 312 become different after the deflection by the asymmetric micro-structured elements of substrate 301. Via multiple reflections and refractions by the surfaces 321, 322 and bottom reflector 302, the light ray (e.g., 313) can emit out of the surface 323.

Figure 4:
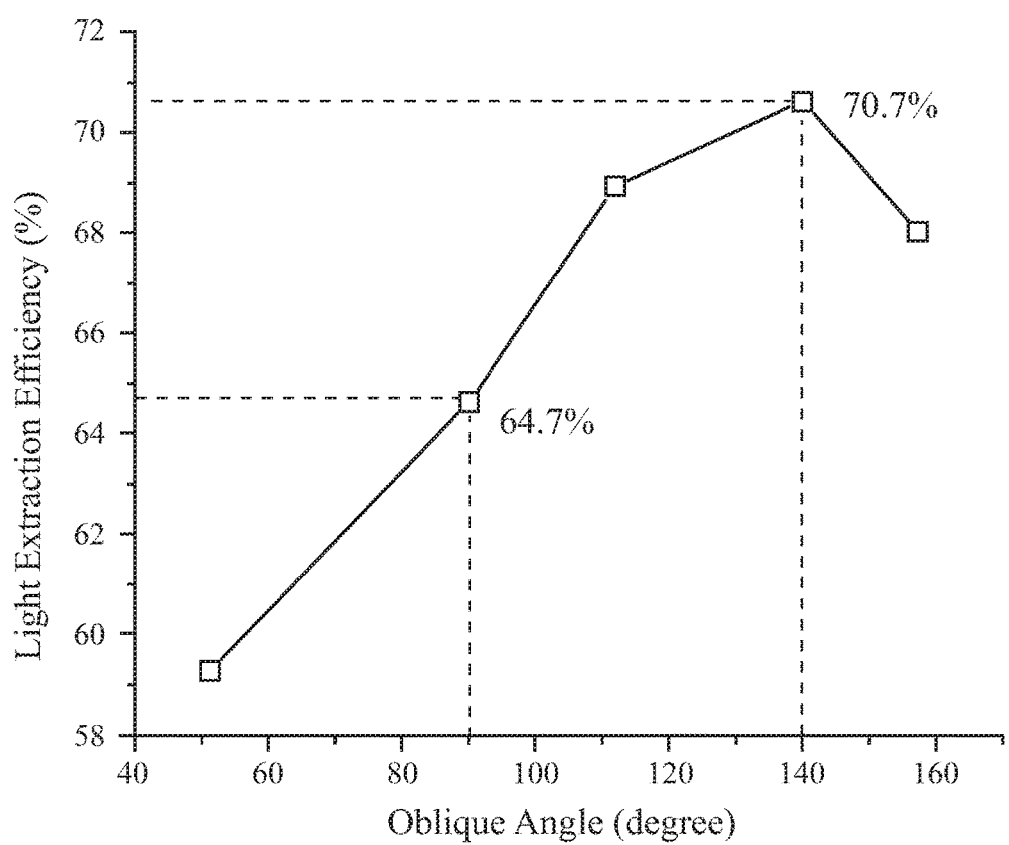
FIG. 4 depicts the calculated light-extraction efficiency (LEE) as a function of an oblique angle β of the substrate, which shows that the LEE reaches the maximum (70.7%) at an obtuse angle β=140°.

FIG. 4 is a graphical presentation of the calculated light-extraction efficiency (LEE) as a function of an oblique angle β. The maximum LEE of the LED that uses the prior art micro-structured substrate that does not contain the obtuse angle is 64.7% at β=90°. However, the LEE of the LED that employs the novel obtuse angle micro-structured substrate in accordance with the present invention may be as high as 70.7% at β=140°, representing a 6.0 percentage point increase. This increase is substantial for the LED market. Embodiments of the LED according to FIG. 3A may have the oblique angle β within a range of 110° to 150°.

Furthermore, such a substrate with a plurality of asymmetric micro-structured elements may also improve the overlap between the electron wave function and the hole wave function due to the semiconductor bandgap structure, which results in a higher internal quantum conversion efficiency.

Figure 5:
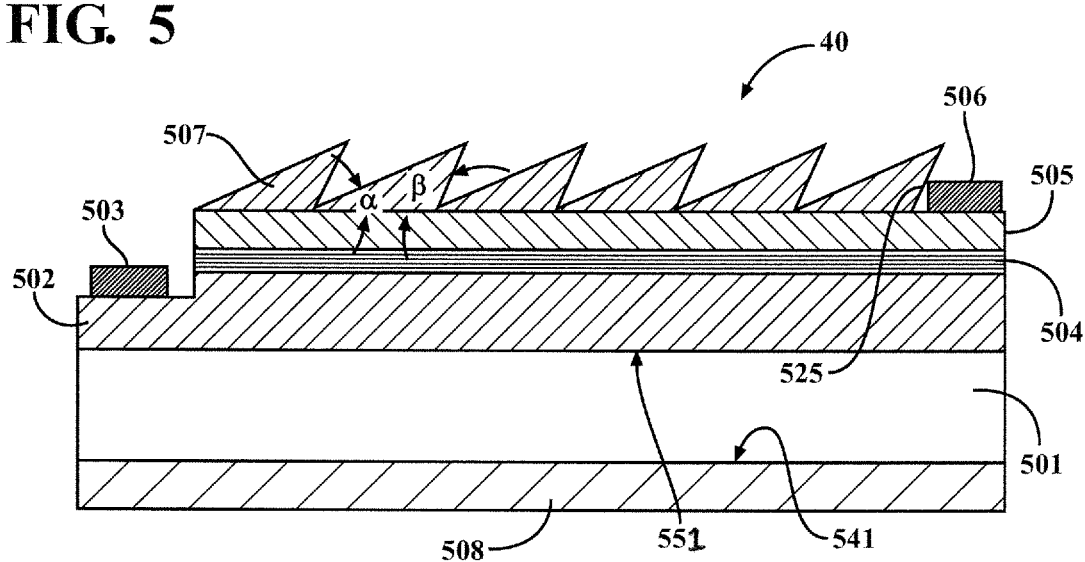
FIG. 5 illustrates a two-dimensional (2D) drawing of another embodiment of the present invention, in which the LED 40 contains a novel protruding asymmetric microstructured overlayer 507.

Another embodiment of the present invention is illustrated in FIG. 5, wherein LED 40 contains an overlayer 507 with a plurality of asymmetric micro-structured elements 525. Similar to the asymmetric micro-structured elements of substrate 301, at least a portion of a surface of each micro-structured element 525 is disposed at an obtuse angle with respect to a second semiconducting layer 505, when measured from within the respective micro-structured element 525. Similarly, each protruding micro-structured element 525 has a shape such that it is asymmetric with respect to a plane substantially parallel to the second semiconducting layer 505 and to a plane substantially perpendicular to the second semiconducting layer 505. Overlayer 507 is transparent within an emission wavelength range of light-emitting diode 40.

The LED 40 is composed of a substrate 501 with a first surface 541 and a second surface 551. A reflection layer 508 is disposed on the first surface 541 and a light-emitting diode structure is arranged on the second surface 551. The light-emitting diode structure includes a n-type GaN layer 502, a n-type electrode 503, an active quantum well layer 504, a p-type GaN 505, a p-type electrode 506, and an overlayer 507 with a plurality of asymmetric micro-structured elements, in which one of the angles α or β is larger than 90°. The active quantum well layer 504 emits light when an electron and a hole recombine. The overlayer 507 having a plurality of asymmetric micro-structured elements may be fabricated on a coated layer (e.g., made of photoresist) by micro and/or nano lithography (such as direct-writing laser lithography). The asymmetric micro-structured element overlayer 507 may also be realized by harnessing a flip-chip light-emitting diode architecture.

Figure 6:
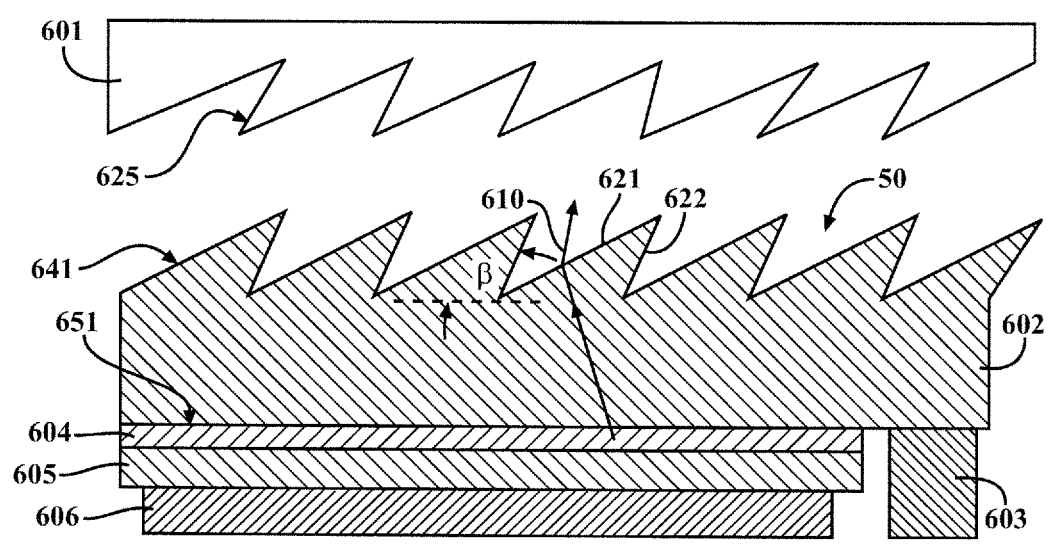
FIG. 6 illustrates a two-dimensional (2D) drawing of another embodiment of the present invention, in which the n-type layer 602 contains protruding asymmetric microstructure elements fabricated by harnessing a flip-chip design.

In accordance with the flip-chip architecture, the following process may be employed to manufacture LED 50, as illustrated in FIG. 6. First, a substrate 601 that includes a plurality of asymmetric micro-structured elements 625 (e.g., made of sapphire, crystalline silicon, crystalline silicon carbide) is created by micro and/or nanolithography such as dry-etching or directional (e.g., UV light assistant) wet-etching. Then, a n-type semiconducting layer (e.g., GaN) 602, active quantum well layer 604, and p-type quantum well layer 605 are grown. The n-type semiconducting layer (e.g., GaN) 602 has a first surface 641 and an opposing second surface 651. For the aluminum (Al), indium (In), gallium (Ga), nitride (N) [Al$_y$In$_x$Ga$_{1-x-y}$N (where 0≤x, y≤1)] or aluminum (Al), gallium (Ga), indium (In), phosphor (P) (AlGaInP) LEDs, the n-type layer 602, the active layer 604 and p-type layer 605 may be grown by the metal organic chemical vapor deposition (MOCVD) method. For the aluminum (Al), gallium (Ga), arsenide (As) (AlGaAs) LEDs, the n-type layer 602, the active layer 604 and p-type layer 605 may be grown by the liquid phase epitaxy (LPE) method. Furthermore, the n-type electrode 603 and p-type electrode 606 may also be fabricated on the grown n-type layer 602 and p-type layer 605 such as by sputtering or evaporation. Moreover, the metallic p-type electrode 606 may also serve as a reflection layer to increase the light extraction efficiency. Finally the substrate layer 601 and n-type layer 602 may be separated (e.g., by the laser lift-off process) so that the light ray 610 can emit out of the n-type layer containing asymmetric micro-structured elements. Now the first surface 641 has a plurality of asymmetric micro-structured elements with surfaces i.e. 621 and 622.

Similar to the asymmetric micro-structured elements of substrate 301, at least a portion of a surface of each micro-structured element is disposed at an obtuse angle with respect to a second surface 651, when measured from within the respective micro-structured element, such that an angle β is larger than 90°. Similarly, each protruding micro-structured element has a shape such that it is asymmetric with respect to a plane substantially parallel to the second surface 651 and also to a plane substantially perpendicular to the second surface 651.

Figure 7:
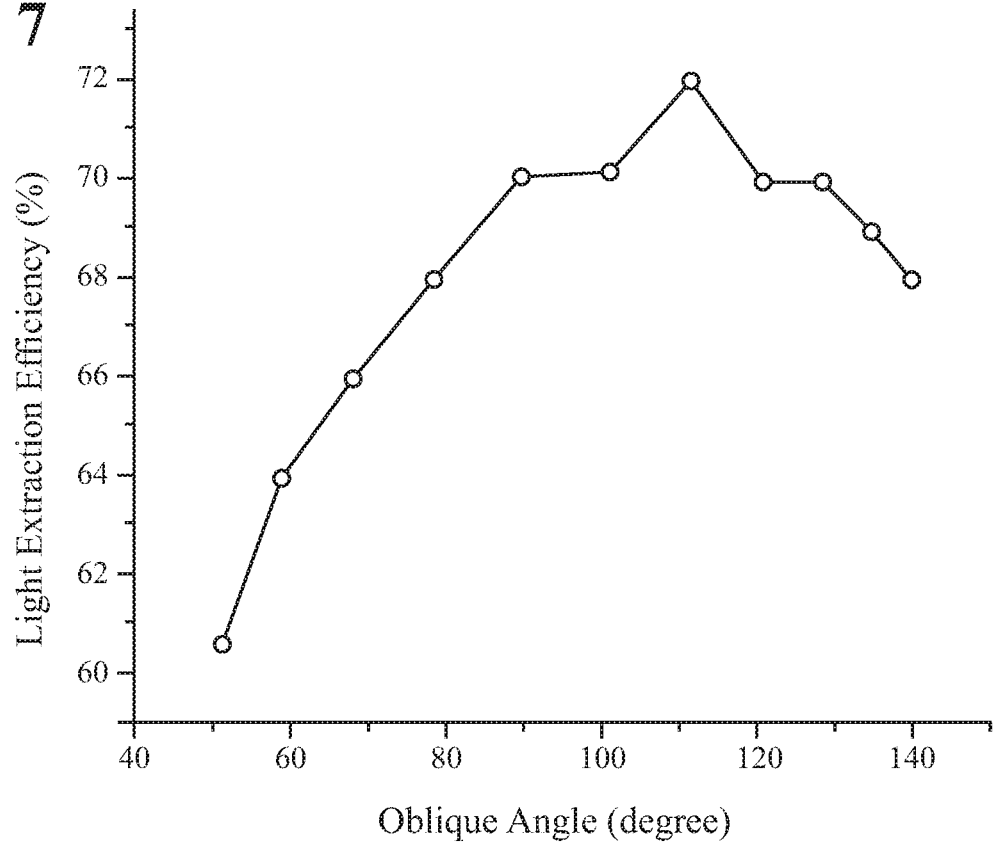
FIG. 7 depicts the calculated light-extraction efficiency (LEE) of a flip-chip LED 50 as a function of an oblique angle β of the n-type layer 602, which shows that the LEE reaches a maximum (72%) at an obtuse angle β=110°.

Again, similar to LED 30 in FIG. 3A that contains the substrate 301 with the plurality of asymmetric micro-structured elements, we also compute the LEE in the flip-chip LED 50 containing n-type layer 602 with the plurality of asymmetric micro-structured elements. FIG. 7 shows the calculated light-extraction efficiency (LEE) as a function of angle β. One can see that the LEE reaches a maximum (LEE=72%) at the obtuse angle β=110°. This again shows the advantage of harnessing the plurality of asymmetric micro-structured elements. Embodiments of the LED according to FIG. 6 may have the oblique angle β within a range of 90° to 130°.

Figure 8:
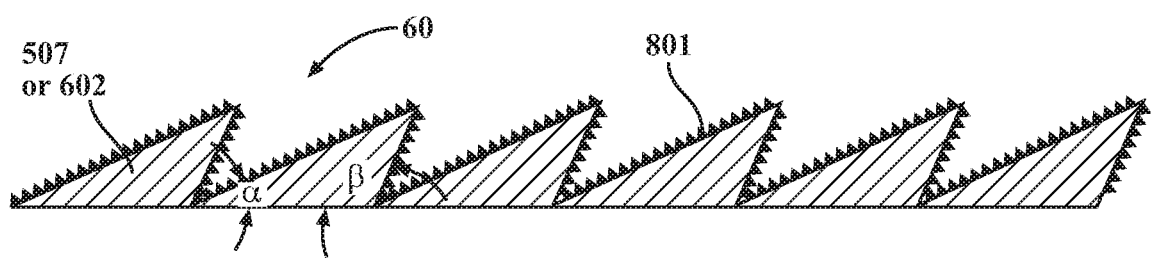
FIG. 8 depicts a LED 60 containing micro/nano-structures 801 created (e.g., by colloidal lithography) on top of the overlayer 507 or n-type substrate 602 having a plurality of asymmetric micro-structured elements.

Another embodiment of the invention is illustrated in FIG. 8, wherein a LED 60 includes micro/nano-structured members 801 created (e.g., by colloidal lithography) on top of overlayer 507 or n-type substrate 602 having the plurality of asymmetric micro-structured elements, as illustrated in FIG. 8. These micro/nano-structured members further increase the LEE of a LED.

Figure 9:
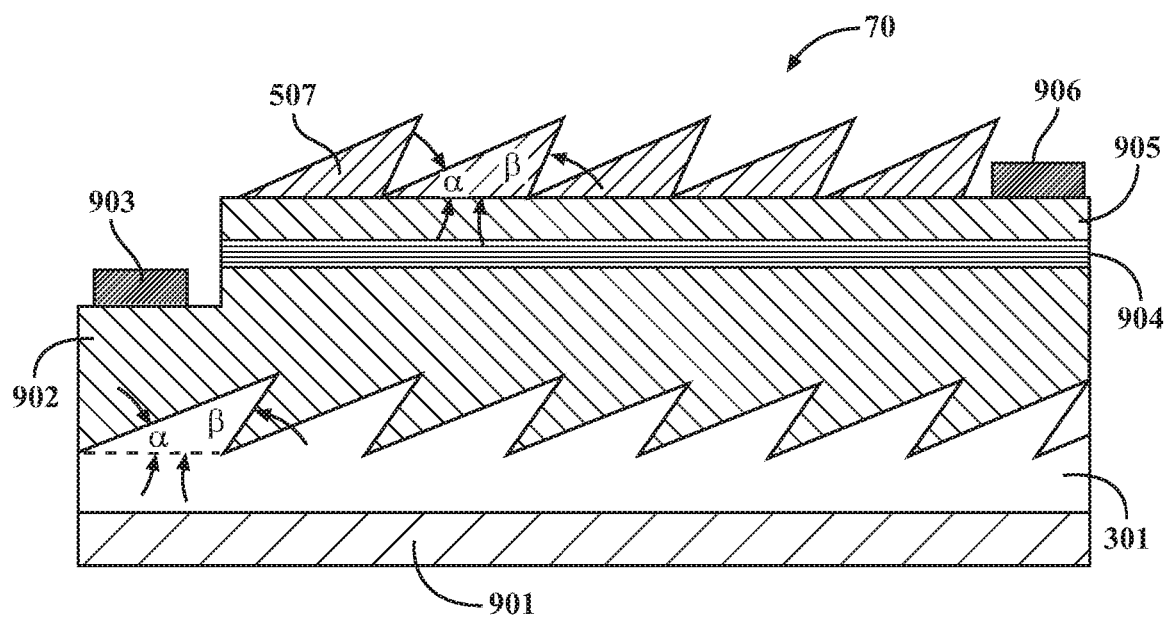
FIG. 9 depicts a LED 70 that contains both a substrate 301 with protruding asymmetric micro-structured elements and a protruding asymmetric micro-structured overlayer 507.

Yet another embodiment of the present invention is illustrated in FIG. 9 as LED 70. LED 70 includes both a substrate 301 with a plurality of asymmetric micro-structured elements and an overlayer 507 with a plurality of asymmetric micro-structured elements, a reflection layer 901, a n-type semiconductor layer 902, a n-type electrode 903, an active quantum well layer 904, a p-type layer 905, and a p-type electrode 906.

Figure 10:
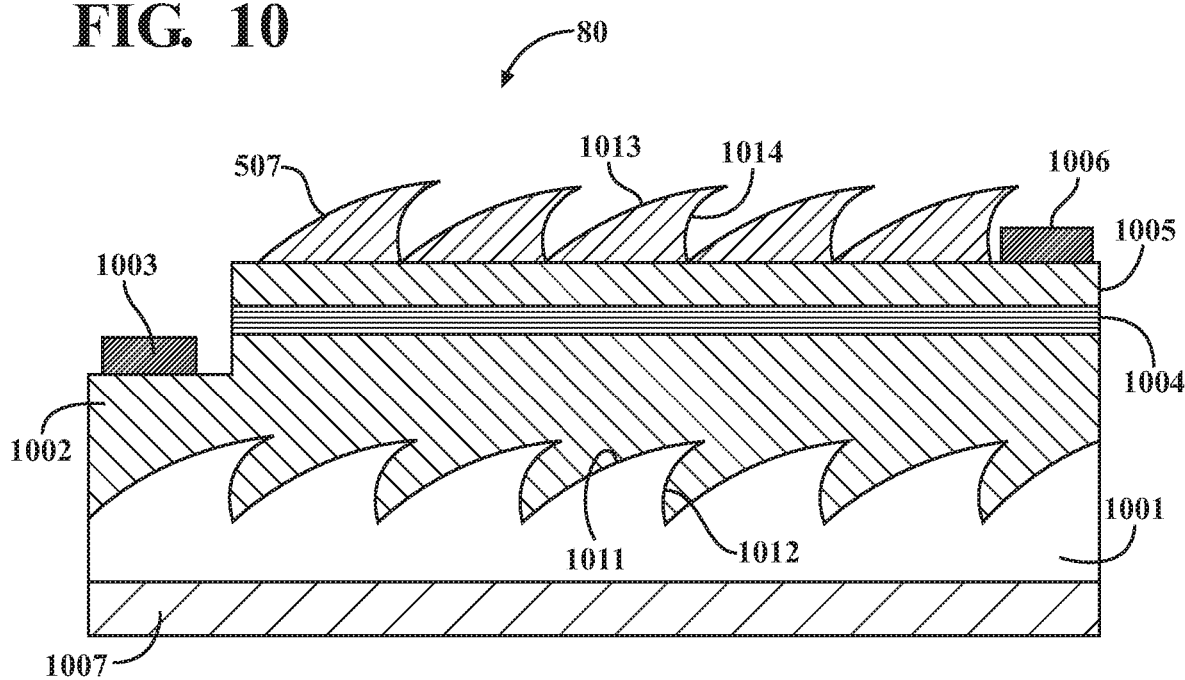
FIG. 10 depicts a LED 80 in which overlayer 507 and n-type substrate 602 both have a plurality of protruding asymmetric micro-structured elements (1011, and/or 1012, and/or 1013, and/or 1014) with curved surfaces.

FIG. 10 depicts LED 80, which is another embodiment of the present invention. LED 80 has curved surfaces (i.e. 1011, and/or 1012, and/or 1013, and/or 1014) for overlayer 507 and for n-type substrate 1001. LED 80 is also made of a substrate 1001, a n-type semiconductor layer 1002, a n-type electrode 1003, an active quantum well layer 1004, a p-type semiconductor layer 1005, and a p-type electrode 1006. In some embodiments, LED 80 may also have a reflection layer 1007.

Figure 11:
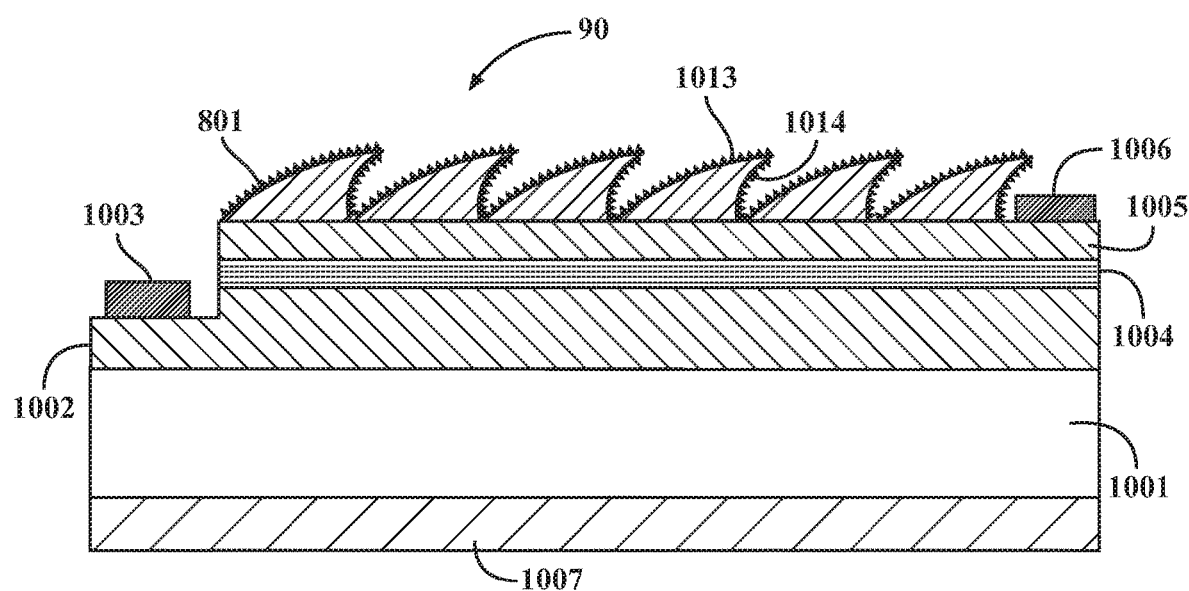
FIG. 11 depicts a LED 90 that contains micro/nano-structure members 801 created on top of the curved surfaces 1013 and/or 1014.

As shown in FIG. 11, some embodiments of the present invention may have micro/nano-structured members 801 created on top of the curved surfaces 1013 and/or 1014 of LED 90.

Having described the invention in detail, those skilled in the art will appreciate that, given the disclosure herein, modification may be made to the invention without departing from the spirit of the invention concept. It is not intended that the scope of the invention be limited to the specific and preferred embodiments illustrated and described. All documents referenced herein are hereby incorporated by reference, with the understanding that where there is any discrepancy between this specification and the incorporated document, this specification controls.

REFERENCES

A. Bay, N. Andre, M. Sarrazin, A. Belarouci, V. Aimez, L. Francis, and J. Vigneron, "optimal overlay inspired by Photuris firefly improves light-extraction efficiency of existing light-emitting diodes," Optics Express 21, pp. A179-A189, 2013.

J. Kim, Y. Lee, H. Kim, K. Choi, H. Kweon, S. Park, and K. Jeong, "Biologically inspired LED lens from cuticular nanostructures of firefly lantern," PNAS 109, pp. 18674-18678, 2012.

J. Wierer, D. Steigerwald, M. Krames, J. O'Shea, M. Ludowise, G. Christenson, Y. Shen, C. Lowery, P. Martin, S. Subramanya, W. Gotz, N. Gardner, R. Kern, and S. Stockman, "High-power AlGaInN flip-chip light-emitting diodes," Applied Physics Letters 78, pp. 3379-3381, 2001.

We claim:

1. A light-emitting diode, comprising;
a substrate having a first surface and an opposing second surface;
a reflection layer disposed on the first surface of the substrate;
a light-emitting diode structure arranged on the second surface of the substrate, the light-emitting diode structure comprising a first semiconducting layer, an active layer and a second semiconducting layer disposed consecutively on the second surface; and
a plurality of protruding asymmetric micro-structured elements defining at least a part of the second surface of the substrate, at least a portion of a surface of each micro-structured element is disposed at an obtuse angle with respect to the first surface of the substrate when measured from within the respective micro-structured element, wherein each protruding micro-structured surface element is asymmetric with respect to a plane substantially parallel to the first surface of the substrate and to a plane substantially perpendicular to the first surface of the substrate.

2. The light-emitting diode of claim 1, wherein the first semiconducting layer comprises a first electrode and/or the second semiconducting layer comprises a second electrode.

3. The light-emitting diode of claim 1, wherein the plurality of protruding asymmetric micro-structured elements each have a curved surface.

4. The light-emitting diode of claim 1, wherein each of the plurality of protruding asymmetric micro-structured elements has a base and the base is selected from the group consisting of a hex shape base, a triangular shape base, a square shape base, a circular shape base, an elliptical shape base and a polygon shape base.

5. The light-emitting diode of claim 1, wherein the plurality of protruding asymmetric micro-structured surface elements of the substrate are created by a dry-etching or direction wet-etching method.

6. The light-emitting diode of claim 1, wherein the substrate comprises sapphire, crystalline silicon, crystalline silicon carbide, gallium nitride, gallium arsenide, indium phosphor or an organic material.

7. The light-emitting diode of claim 1, further comprising an overlayer disposed on the second semiconducting layer, the overlayer having a plurality of protruding asymmetric micro-structured elements, at least a portion of a surface of each micro-structured element of the overlayer being disposed at an obtuse angle with respect to the second semiconducting layer when measured from within the respective micro-structured element, wherein each protruding micro-structured element of the overlayer is asymmetric with respect to a plane substantially parallel to the second semiconducting layer and to a plane substantially perpendicular to the second semiconducting layer.

8. The light-emitting diode of claim 7, further having a plurality of micro and/or nano structured members disposed on each of the plurality of protruding asymmetric micro-structured elements of the overlayer.

9. The light-emitting diode of claim 7, wherein the plurality of protruding asymmetric micro-structured elements of the overlayer each have a curved surface.

10. The light-emitting diode of claim 1, wherein the first semiconducting layer and the second semiconducting layer comprise a n-type layer and a p-type layer respectively.

11. The light-emitting diode of claim 1, wherein the first semiconducting layer or the second semiconducting layer comprises a doped $(Al_xGa_{1-x})_yIn_{1-y}P$ (where 0≤x, y≤1), doped $Al_yIn_xGa_{1-x-y}N$ (where 0≤x, y≤1), doped $Al_xGa_{1-x}As$ (0≤x≤1), or doped organic material, wherein Al is aluminum, Ga is gallium, In is indium, P is phosphor, As is arsenide, and N is nitride.

12. The light-emitting diode of claim 11, wherein the first semiconductor layer or the second semiconducting layer is doped with Silicon (Si) or Magnesium (Mg).

13. The light-emitting diode of claim 11, wherein the doped $(Al_xGa_{1-x})_yIn_{1-y}P$ or the doped $Al_yIn_xGa_{1-x-y}N$ is grown by a metal oxide chemical vapor deposition (MOCVD) method.

14. The light-emitting diode of claim 11, wherein the doped $Al_xGa_{1-x}As$ is grown by a liquid phase epitaxy (LPE) method.

15. The light-emitting diode of claim 1, wherein the obtuse angle is within a range of about 110° to 150°.

16. A light-emitting diode, comprising;
a substrate having a first surface and an opposing second surface;
a reflection layer disposed on the first surface of the substrate;
a light-emitting diode structure arranged on the second surface of the substrate, the light-emitting diode structure comprising a first semiconducting layer, an active layer, a second semiconducting layer and an overlayer disposed consecutively on the second surface; and
the overlayer having a plurality of protruding asymmetric micro-structured elements each having a curved surface, at least a portion of a surface of each micro-structured element of the overlayer being disposed at an obtuse angle with respect to the second semiconducting layer when measured from within the respective micro-structured element, wherein each protruding micro-structured element of the overlayer is asymmetric with respect to a plane substantially parallel to the second semiconducting layer and to a plane substantially perpendicular to the second semiconducting layer and the overlayer is transparent within an emission wavelength range of the light-emitting diode.

17. The light-emitting diode of claim 16, further having a plurality of micro and/or nano structured members disposed on each of the plurality of protruding asymmetric micro-structured elements of the overlayer.

18. A light-emitting diode, comprising:
a first semiconducting layer having a first surface and an opposing second surface;
a first electrode arranged on the first semiconducting layer;
a light-emitting diode structure arranged on the second surface of the first semiconducting layer, the light-emitting diode structure comprising an active layer, a second semiconducting layer and a second electrode disposed consecutively on the second surface;
a plurality of protruding asymmetric micro-structured elements defining at least a part of the first surface of the first semiconducting layer, at least a portion of a surface of each micro-structured element being disposed at an obtuse angle with respect to the second surface of the first semiconducting layer when measured from within the respective micro-structured element, wherein each protruding micro-structured element is asymmetric with respect to a plane substantially parallel to the second surface of the first semiconducting layer and to a plane substantially perpendicular to the second surface of the first semiconducting layer; and a plurality of micro and/or nano structured members disposed on each of the plurality of protruding asymmetric micro-structured elements of the first surface of the first semiconducting layer.

* * * * *